United States Patent [19]
Arimoto

[11] Patent Number: 4,788,580
[45] Date of Patent: Nov. 29, 1988

[54] SEMICONDUCTOR MEMORY AND METHOD OF MANUFACTURING THE SAME

[75] Inventor: Kazutami Arimoto, Hyogo, Japan

[73] Assignee: Mitsubishi Denki Kabushiki Kaisha, Tokyo, Japan

[21] Appl. No.: 932,222

[22] Filed: Nov. 18, 1986

[30] Foreign Application Priority Data

Nov. 22, 1985 [JP] Japan .................. 60-262770
Nov. 22, 1985 [JP] Japan .................. 60-262771

[51] Int. Cl.⁴ .................................. H01L 29/78
[52] U.S. Cl. .................................. 357/23.6
[58] Field of Search .................. 357/23.6, 51

[56] References Cited

U.S. PATENT DOCUMENTS 4,328,611  5/1982  Harrington ............... 29/580

FOREIGN PATENT DOCUMENTS 56-37663   4/1981  Japan ................ 357/23.6
56-129367 10/1981  Japan .
57-210665 12/1982  Japan .
2114814    8/1983  United Kingdom .

OTHER PUBLICATIONS

IBM Technical Disclosure Bulletin, vol. 26, No. 3A, Aug. 1983, pp. 940–942, New York, G. A. Sai–Halasz et al: "Bipolar dynamic RAM cell structure with low soft–error rate".

"Building a dynamic RAM with SMOS", Electronic Design, Mar. 18, 1982, p. 233.

Primary Examiner—Andrew J. James
Assistant Examiner—Mark Prenty
Attorney, Agent, or Firm—Lowe, Price, LeBlanc, Becker & Shur

[57] ABSTRACT

A semiconductor memory comprises a p⁻-type semiconductor substrate (1), a p-type epitaxial layer (15) and p⁺-type epitaxial layers (16, 17) formed thereon, an n⁺-type region (6) formed on the p⁺-type epitaxial layer (16) to serve as a bit line, an n⁺-type region (5) formed on the p⁺-type epitaxial layer (17) to serve as a charge storage region and a gate electrode (9) formed on the p-type epitaxial layer (15) to serve as a word line. The p⁺-type epitaxial layers (16, 17) prevent passage of electrons within electron-hole pairs induced by alpha rays, to suppress occurrence of soft errors. The p-type epitaxial layer (15) defines a region corresponding to the channel region of a bus transistor, whereby the impurity concentration thereof can be easily controlled, to readily set the threshold voltage of the bus transistor at an appropriate level.

8 Claims, 6 Drawing Sheets

SEMICONDUCTOR MEMORY AND METHOD OF MANUFACTURING THE SAME

BACKGROND OF THE INVENTION

1. Field of the Invention

The present invention relates to a semiconductor memory and a method of manufacturing the same, and more specifically, it relates to a semiconductor memory such as a dynamic RAM (random access memory) which stores data by presence/absence of stored charges and a method of manufacturing the same.

2. Description of the Prior Art

A well-known example of a conventional semiconductor memory is a dynamic RAM, which stores data by presence/absence of stored charges. A method of manufacturing such a dynamic RAM is disclosed in, e.g., "Building a Dynamic RAM with SMOS", Electronic Design, Mar. 18, 1982, p. 233.

FIG. 1 is a sectional view showing an example of such a conventional semiconductor memory, which is disclosed in Japanese Patent Laying-Open Gazette No. 210665/1982, for example.

Description is now made on the structure of the conventional semiconductor memory as shown in FIG. 1.

Referring to FIG. 1, p+-type impurity is selectively implanted and diffused in a $p^{31}$-type semiconductor substrate 1 to form a p+-type region 2 for isolating elements and preventing inversion and parasitism, while an insulator film 3 for isolating elements is simultaneously formed on the same. Further, $p^{30}$-type impurity is implanted and diffused by using the insulator film 3 as a mask, to form a p+-type region 4 in the p−-type semiconductor substrate 1 being higher in impurity concentration than the p−-type substrate 1 as an operating region. Thereafter an n+-type region 5 serving as a charge storage region for storing data and an n+-type region 6 serving as a bit line are formed to be enclosed by the p+-type region 4. A gate oxide film 7 is formed on these regions, and a first layer gate electrode 8 and a second layer gate electrode 9 are formed on the same. These gate electrodes 8 and 9 are isolated from each other by an interlayer insulation film 10. The first layer gate electrode 8 is connected to a power supply (not shown) through a terminal 11, while the second layer gate electrode 9 is connected to a word line (not shown) through a terminal 12. A depletion layer 13 is defined around the n+-type region 5 and another depletion layer 14 is defined around the n+-type region 6.

For convenience of illustration, interconnection parts and a protective film are omitted in FIG. 1. Further, while the n+-type region 5 is illustrated as an n+-type diffusion region in FIG. 1 for convenience of illustration, generally a positive potential is applied to the first layer gate electrode 8 to induce an n+-type inversion layer on a surface portion of the p+-type region 4 corresponding to the n+-type region 5 through the gate insulator film 7, thereby to store charges therein.

In the conventional semiconductor memory as shown in FIG. 1, a bus transistor is formed in the p+-type region 4 which is higher in impurity concentration than the semiconductor substrate 1, and the threshold voltage of this bus transistor is generally set to be higher than that of a peripheral transistor in consideration of stable operation of the memory. When the threshold voltage defined by the impurity concentration of the p+-type region 4 is too high, the threshold voltage of the bus transistor can be controlled by n+-type channel dose after formation of n+-type regions 5 and 6.

Description is now made on the operation of the semiconductor memor as shown in FIG. 1.

In the semiconductor memory as shown in FIG. 1, a state in which the n+-type region 5 serving as a charge storage region of the memory cell stores electrons is defined as "0" and a state in which the same stores no charge is defined as "1". The potential of the n+-type region 6 serving as a bit line is precharged at a prescribed level by a sense amplifier (not shown).

When the potential of a word line is increased and that of the second layer gate electrode 9, which is connected to the word line for serving as a transfer gate, exceeds the threshold voltage, a channel of an n+-type inversion layer is formed directly under the gate electrode 9, whereby the n+-type regions 5 and 6 are caused to conduct.

When storage data of the memory cell is "0", i.e., when the n+-type region 5 stores electrons, the potential of the n+-type region 6, having been held at the precharged potential level, is decreased by the conduction of the n+-type regions 5 and 6. When, on the other hand, storage data of the memory cell is "1", i.e., the n+-type region 5 stores no electron, the potential of the n+-type region 6, having been at an intermediate potential level, is increased by the conduction of the n+-type regions 5 and 6. Such potential change of the bit line is sensed by the sense amplifier to amplify and extract the same, while the same storage data is refreshed to be rewritten in the memory cell within the same cycle.

With development of a 16k dynamic RAM, remarkably caused are malfunctions (hereinafter referred to as soft errors) in which original storage data are inverted by alpha rays or the like. Such soft errors are caused since electrons within electron-hole pairs generated upon incidence of radioactive rays such as alpha rays are collected in the n+-type region 5 serving as a charge storage region and the n+-type region 6 serving as a bit line.

In further detail, alpha rays entering the semiconductor chip generate a large number of electron-hole pairs along the range thereof before being stopped by losing energy, and particularly those generated in the depletion layers 13 and 14 are immediately separated by the electric fields in the depletion layers 13 and 14 so that the electrons are collected in the n+-type regions 5 and 6 and the holes flow down through the p−-type substrate 1. The electron-hole pairs generated within n+-type regions 5 and 6 are recombined, and hence the same exert no influence on increase/decrease of the electrons within the n+-type regions 5 and 6. Further, within the electron-hole pairs generated in the p−-type substrate 1, only electrons reaching the depletion layers 13 and 14 by diffusion are collected in the n+-type layers 5 and 6 to cause the soft error, while the remaining electrons are recombined in the p−-type substrate 1.

In the semiconductor memory as shown in FIG. 1, the n+-type regions 5 and 6 are enclosed by the p+-type region 4 which is higher in impurity concentration than the p−-type substrate 1, whereby the depletion layers 13 and 14 defined in the interfaces between the n+-type regions 5 and 6 and the p+-type region 4 are reduced in width and the n+-type regions 5 and 6 are increased in capacity. Thus, increased is difference between electron numbers corresponding to "0" and "1" stored in the n+-type regions 5 and 6, to provide allowance with respect to the electrons generated by incidence of alpha rays or the like. Further, since the n+-type regions 5 and 6 are formed in the p+-type region 4, the electrons diffused from the p−-type substrate 1 are recombined in the p+-type region 4 not to reach the n+-type regions 5 and 6, while a potential barrier against the electrons is defined in the interface between the p−-type substrate 1 and the p+-type region 4 to prevent passage of low-energy electrons within those diffused from the p−-type substrate 1. Thus, occurrence of soft errors can be prevented by the structure as shown in FIG. 1.

However, the conventional semiconductor memory of the aforementioned structure requires a considerable time for the process of forming the p+-type region 4 which is higher in impurity concentration than the p−-type substrate 1, while it is difficult to control the impurity concentration and the threshold voltage of the bus transistor and junction pressure resistance are easily changed.

SUMMARY OF THE INVENTION

Briefly stated, provided according to the present invention is a semiconductor memory which comprises a first conductivity type semiconductor substrate, a first conductivity type first epitaxial layer formed on the semiconductor substrate and being higher in impurity concentration than the semiconductor substrate so that the first epitaxial layer at least partially defines a channel region, at least two first conductivity type first regions adapted to be separated by at least a portion of the first epitaxial layer defining the channel region and being higher in impurity concentration than the first epitaxial layer, a second conductivity type region formed on one of the first regions to serve as a bit line, a second conductivity type third region formed on the other one of the first regions to serve as a charge storage region, a first gate electrode formed on the portion of the first epitaxial layer defining the channel region to serve as a word line and a second gate electrode formed on the second conductivity type third region to supply constant voltage.

In another aspect of the present invention, the first conductivity type first regions are second epitaxial layers formed on the semiconductor substrate.

In still another aspect of the present invention, a method of manufacturing a semiconductor memory includes the steps of preparing a first conductivity type semiconductor substrate, forming a first conductivity type first epitaxial layer on the semiconductor substrate to be higher in impurity concentration than the semiconductor substrate, forming at least two first conductivity type first regions being higher in impurity concentration than the first epitaxial layer and being separated by at least a portion of the first epitaxial layer to define a channel region, forming a first gate electrode serving as a word line on the portion of the first epitaxial layer to define the channel region, forming a second conductivity type second region serving as a bit line on one of the first regions, forming a second conductivity type third region serving as a charge storage region on the other one of the first regions and forming a second gate electrode for supplying constant voltage on the second conductivity type third region.

In a further aspect of the present invention, the step of forming the first regions includes the steps of removing the first epitaxial layer leaving the portion to define a channel region and forming second epitaxial layers as the first regions in the portions on the semiconductor substrate from which the first epitaxial layer is removed.

In a still further aspect of the present invention, the step of forming the first regions includes the step of ion-implanting first conductivity type impurity in the portions of the first epitaxial layer except for the portion to define a channel region.

Accordingly, a principal object of the present invention is to provide a semiconductor memory which can easily control threshold voltage and junction pressure resistance of a bus transistor formed on a semiconductor substrate and a method of manufacturing the same.

Another object of the present invention is to provide a semiconductor memory which can reduce the time required for the manufacturing process and a method of manufacturing the same.

A principal advantage of the present invention is that it is easy to control impurity concentration of a layer formed on a semiconductor substrate for preventing soft errors caused by alpha rays or the like, which layer is identical in conductivity type to and higher in impurity concentration than the semiconductor substrate.

Another advantage of the present invention is that the threshold voltage of a bus transistor can be easily set at an optimum level by formation of a first epitaxial layer whose impurity concentration can be easily controlled, while thickness of depletion layers around second and third regions can be controlled in a wide range by arbitrarily controlling impurity concentration of first regions being higher in impurity concentration to reduce electron-hole pairs induced by alpha rays or the like, thereby to prevent soft errors caused by alpha rays.

A further advantage of the present invention is that steps of implanting/diffusing impurity can be decreased by employment of epitaxial layers, whereby the manufacturing process is simplified.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
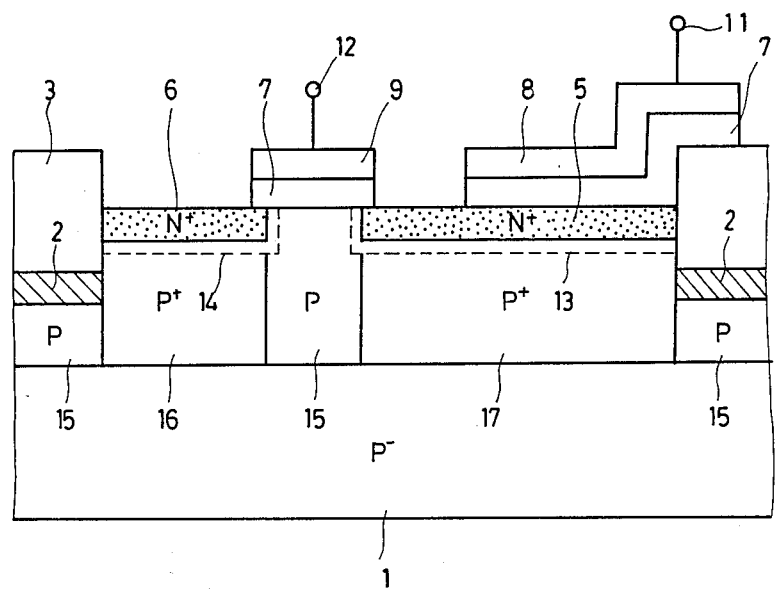
FIG. 2 is a sectional view showing a semiconductor memory according to an embodiment of the present invention.

FIG. 2 is a sectional view showing a semiconductor memory according to an embodiment of the present invention.

Description is now made on the structure of the embodiment as shown in FIG. 2.

Figure 1:
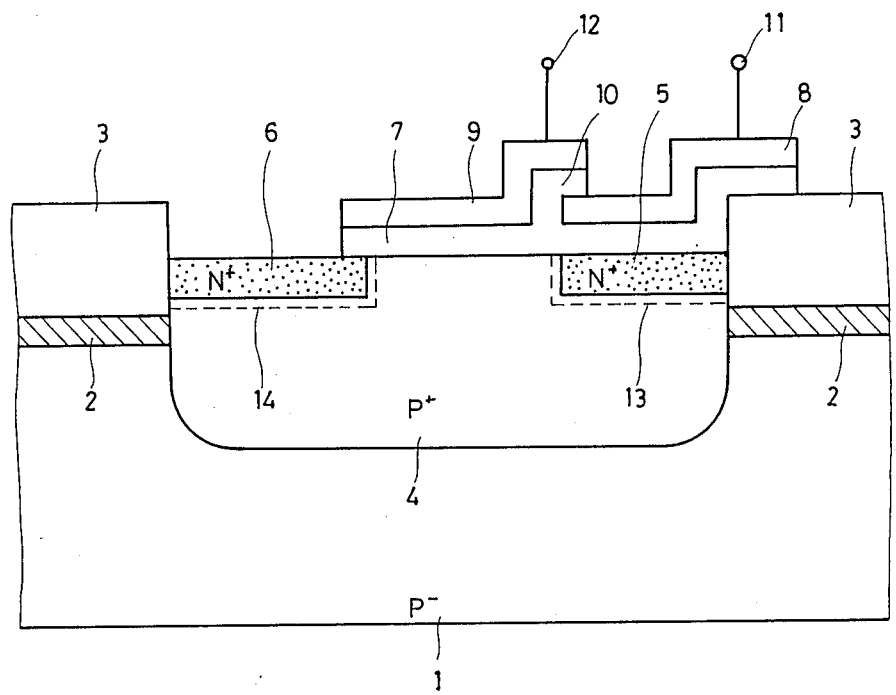
FIG. 1 is a sectional view showing a conventional semiconductor memory.

Referring to FIG. 2, a p-type first epitaxial layer 15 and p+-type second epitaxial layers 16 and 17 are formed on a p−-type semiconductor substrate 1. An n+-type region 6 serving as a bit line is formed on the p+-type epitaxial layer 16 and an n+-type region 5 serving as a charge storage region for storing data is formed on the p+-type epitaxial layer 17. A gate oxide layer 7 is formed on the p-type epitaxial layer 15, and a second layer gate electrode 9 is formed further thereon. Another gate oxide film 7 is formed on the n+-type region 5, and a first layer gate electrode 8 is formed on the same. The first layer gate electrode 8 is connected to a power supply (not shown) through a terminal 11, while the second layer gate electrode 9 is connected to a word line (not shown) through a terminal 12. A depletion layer 13 is defined around the n+-type region 5, while a depletion layer 14 is defined around the n+-type region 6. The operation of the embodiment as shown in FIG. 2 is basically identical to that of the conventional semiconductor memory as shown in FIG. 1, and description thereof is omitted. In the embodiment as shown in FIG. 2, the n+-type regions 5 and 6 are formed in the p+-type regions so that the depletion layers 13 and 14 can be reduced in width or electrons diffused from the p−-type. substrate 1 can be recombined in the p+-type regions 16 and 17, while a potential barrier is defined against injection of electrons from the p−-type substrate 1, similarly to the conventional semiconductor memory as hereinabove described. Thus, the semiconductor memory as shown in FIG. 2 can suppress soft errors caused by alpha rays or the like, similarly to the conventional one.

FIGS. 3A to 3D are sectional views showing principal steps/stages of a method of manufacturing the semiconductor memory as shown in FIG. 2.

With reference to FIGS. 3A to 3D, description is now made on the method of manufacturing the semiconductor memory a shown in FIG. 2.

Figure 3A:
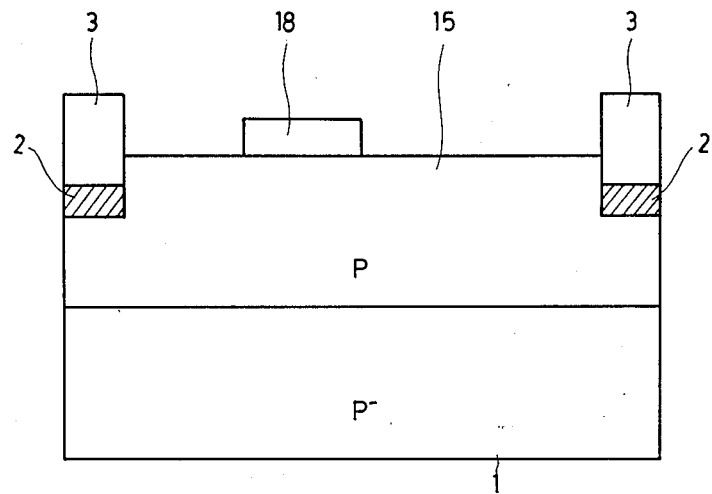
FIGS. 3A to 3D are sectional views showing principal steps/stages of a method of manufacturing the semiconductor memory as shown in FIG. 2.

Referring to FIG. 3A, a p-type first epitaxial layer 15 is formed on a p−-type semiconductor substrate 1. Impurity concentration of this p-type epitaxial layer 15 can be arbitrarily controlled to set the threshold voltage of a bus transistor at an optimum level. Then formed are an insulator film 3 for isolating elements and a p+-type region 2 for preventing inversion and parasitism. Further, a mask 18 is formed on the p-type epitaxial layer 15 by a material such as $SiO_2$. The material for the mask 18 is selected from substances which can prevent growth of an Si epitaxial layer in formation of second epitaxial layers, as hereinafter described.

Figure 3B:
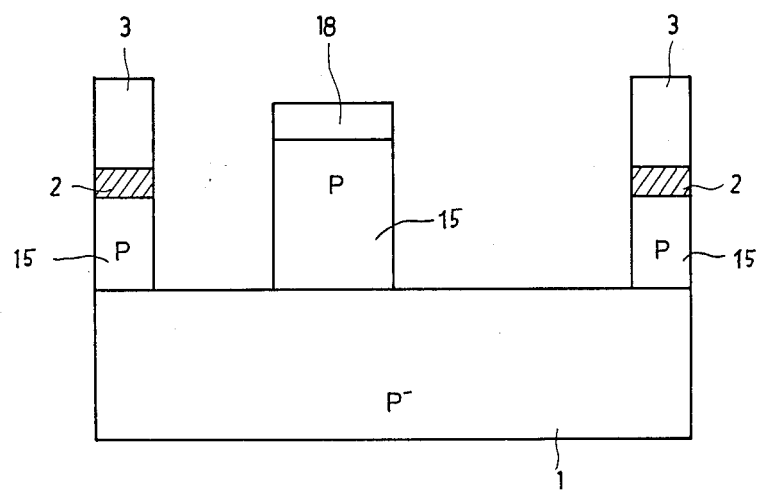

Referring to FIG. 3B, the p-type first epitaxial layer 15 is selectively removed by etching through the mask 18.

Figure 3C:
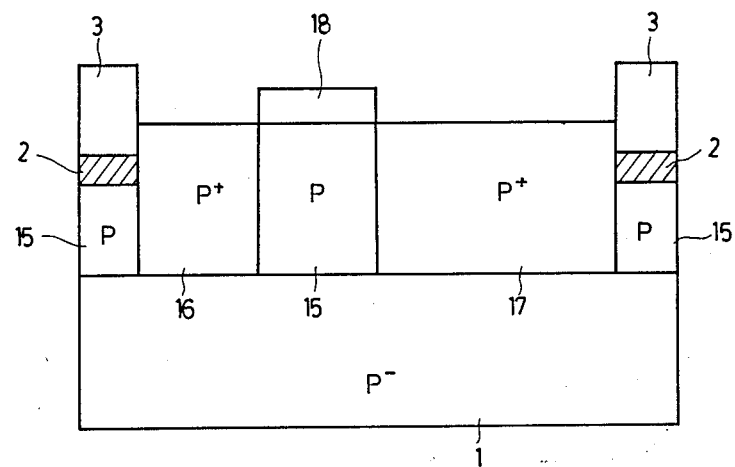

Referring to FIG. 3C, p+-type second epitaxial layers 16 and 17 of higher concentration are grown in portions of the first epitaxial layer 15 removed by etching, to be identical in thickness to the first epitaxial layer 15. The p+-type epitaxial layers 16 and 17 can also be arbitrarily controlled in impurity concentration to control the width of depletion layers 13 and 14 in a wide range, thereby to further reduce electron-hole pairs induced by alpha rays in the depletion layers 13 and 14. Since the first and second epitaxial layers 15 to 17 are employed as hereinabove described, the impurity implantation/diffusion step for forming the conventional p+-type region 4 is not required while the p+-type layers of high impurity concentration can be easily formed.

Figure 3D:
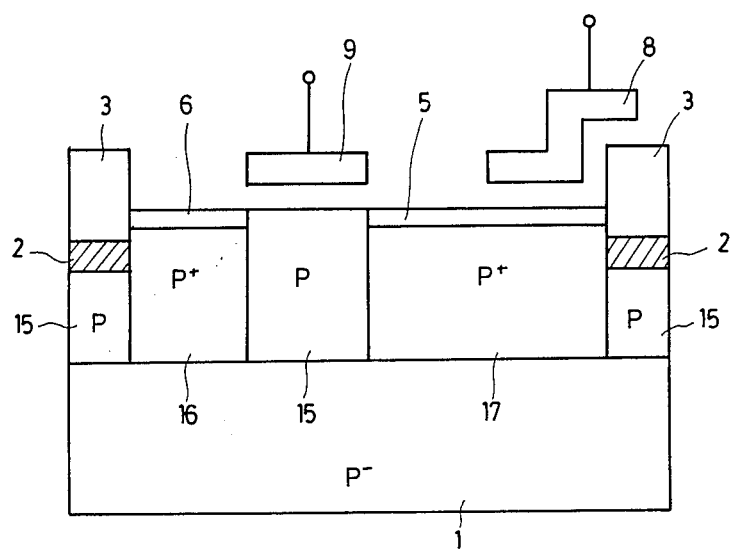

Referring to FIG. 3D, the mask 18 is removed to thereafter form a second layer gate electrode 9, which in turn is employed as a mask for implanting n+-type impurity through a self-alignment process, thereby to form n+-type regions 5 and 6. Thereafter a first layer gate electrode 8 is formed to complete the semiconductor memory as shown in FIG. 2.

Figure 4:
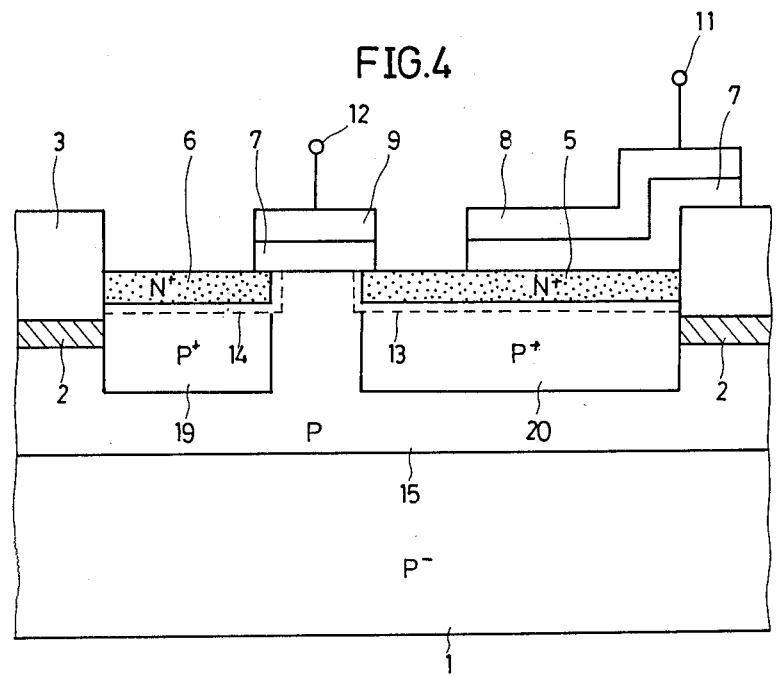
FIG. 4 is a sectional view showing a semiconductor memory according to another embodiment of the present invention.

FIG. 4 is a sectional view showing a semiconductor memory according to another embodiment of the present invention.

The embodiment as shown in FIG. 4 is identical in structure to that shown in FIG. 2 except for the following points: While the p+-type second epitaxial layers 16 and 17 are directly formed on the p−-type semiconductor substrate 1 in the embodiment as shown in FIG. 2, p+-type regions 19 and 20 of high impurity concentration are formed in a p-type first epitaxial layer 15 by implantation of p-type impurity in the embodiment as shown in FIG. 4. Also in the embodiment as shown in FIG. 4, n+-type regions 5 and 6 are formed in the p+-type regions, thereby to suppress soft errors caused by alpha rays or the like.

FIGS. 5A to 5D are sectional views showing principal steps/stages of a method of manufacturing the semiconductor memory as shown in FIG. 4.

With reference to FIGS. 5A to 5D, description is now made on the method of manufacturing the semiconductor memory as shown in FIG. 4.

Figure 5A:
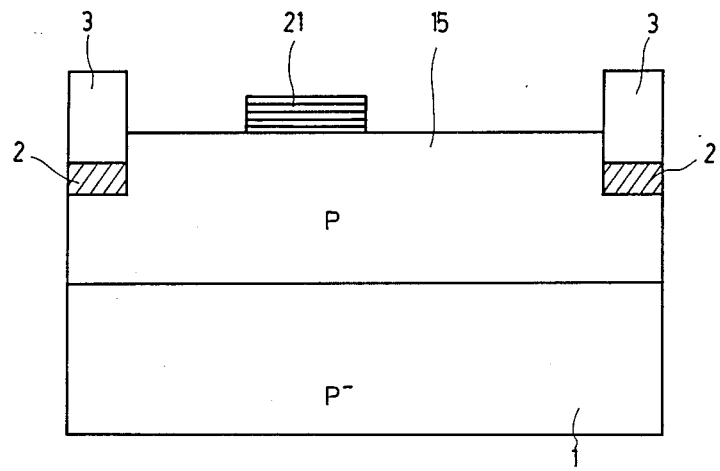
FIGS. 5A to 5D are sectional views showing principal steps/stages of a method of manufacturing the semiconductor memory as shown in FIG. 4.

Referring to FIG. 5A, a p-type epitaxial layer 15 is formed on a p−-type semiconductor substrate 1. Impurity concentration of the p-type epitaxial layer 15 can be arbitrarily controlled, to set the threshold voltage of a bus transistor controlled by a word line at an optimum level. Through employment of the epitaxial layer 15, an impurity implantation/diffusion step for forming p+-type regions can be remarkably simplified in comparison with the conventional case. Then formed are an insulator film 3 for isolating elements and a p+-type region 2 for preventing inversion and parasitism. Thereafter a mask 21 such as a resist film is formed on the p-type epitaxial layer 15.

Figure 5B:
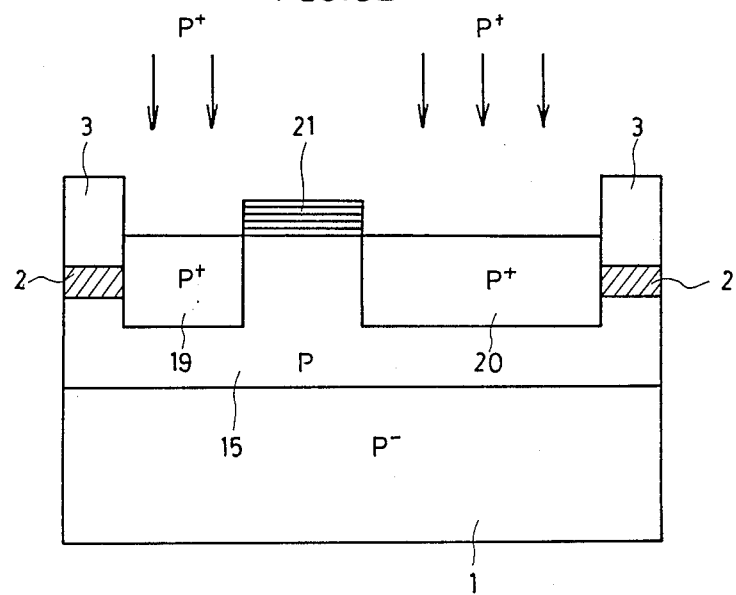

Referring to FIG. 5B, p-type impurity is selectively implanted into the epitaxial layer 15 through the mask 21 to form p+-type regions 19 and 20 of higher concentration.

Figure 5C:
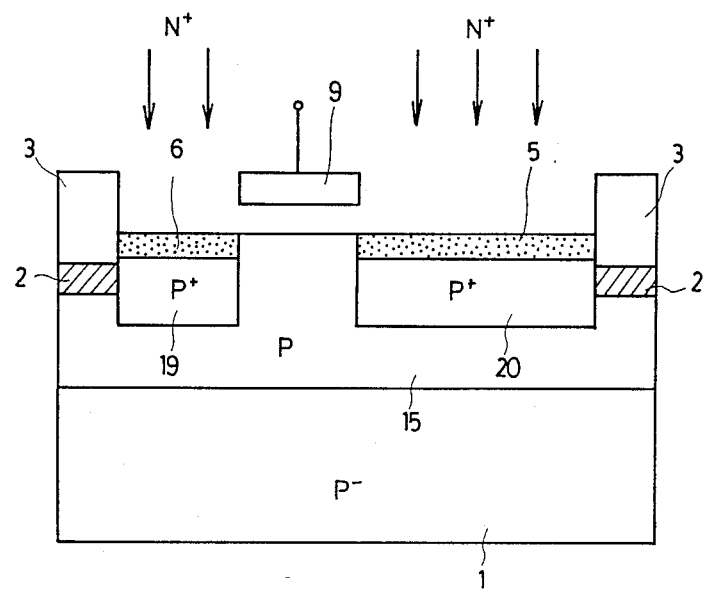

Referring to FIG. 5C, the mask 21 is removed to thereafter form a second layer gate electrode 9, which in turn is utilized as a mask to implant n-type impurity through a self-alignment process, thereby to form n+-type regions 5 and 6.

Figure 5D:
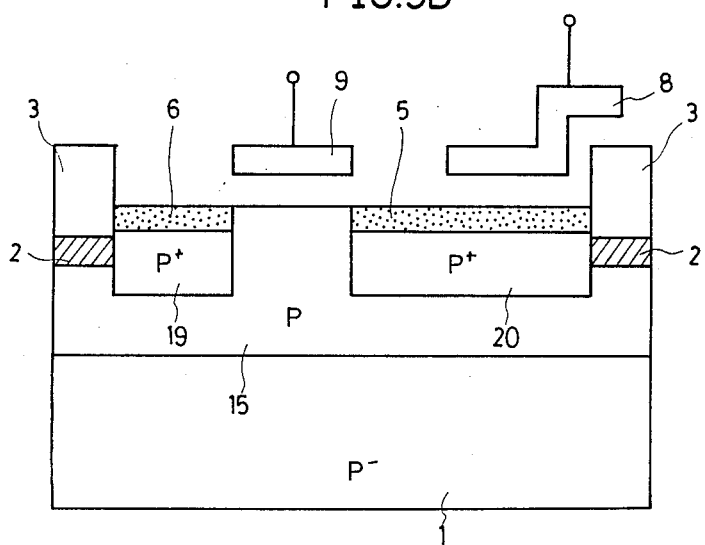

Referring to FIG. 5D, a first layer gate electrode 8 is formed to complete the semiconductor memory as shown in FIG. 4.

It has been found by experiments that each of the embodiments as shown in FIGS. 2 and 4 is sufficiently improved against soft errors while being provided with sufficient allowance with respect to junction pressure resistance when the p−-type semiconductor substrate 1 is about $10^{15}$ cm$^{-3}$, the p-type epitaxial layer 15 is about $10^{15}$ to $10^{16}$ cm$^{-3}$, the p+-type epitaxial layers 16 and 17 or the p+-type regions 19 and 20 are about $10^{16}$ to $10^{18}$ cm$^{-3}$ and the n+-type regions 5 and 6 are about $10^{-}$ to $10^{20}$ cm$^{-3}$ in impurity concentration.

The p +-type regions may not be formed over the entire surface of the semiconductor wafer, but may be selectively grown only in the array part of the memory cell.

Although the above description has been made with reference to a dynamic type semiconductor memory, the present invention is also applicable to a static type semiconductor memory.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory comprising:
    a first conductivity type semiconductor substrate (1);
    a first conductivity type first epitaxial layer (15) formed on said semiconductor substrate and being higher in impurity concentration than said semiconductor substrate, said first epitaxial layer defining a channel region;
    at least two first conductivity type second epitaxial layers (16, 17) adapted to be separated by said first epitaxial layer defining said channel region, said second epitaxial layers being higher in impurity concentration than said first epitaxial layer;
    a second conductivity type second region (6) formed on one of said second epitaxial layers to serve as a bit line;
    a second conductivity type third region (5) formed on the other one of said second epitaxial layers to serve as a charge storage region;
    a first gate electrode (9) formed on said portion of said first epitaxial layer defining said channel region to serve as a word line; and
    a second gate electrode (8) formed on said second conductivity type third region to supply constant voltage.

2. A semiconductor memory in accordance with claim 1 wherein,
    said first conductivity type semiconductor substrate is $10^{15}$ cm$^{-3}$ in impurity concentration,
    said first conductivity type first epitaxial layer is $10^{15}$ to $10^{16}$ cm$^{-3}$ in impurity concentration,
    said first conductivity type second epitaxial layers are $10^{16}$ to $10^{18}$ cm$^{-3}$ in impurity concentration, and
    said second conductivity type second and third regions are $10^{18}$ to $10^{20}$ cm$^{-3}$ in impurity concentration.

3. The semiconductor memory of claim 1, wherein
    said first conductivity type semiconductor substrate is a p-type semiconductor substrate; and
    said second conductvity type second region is an n-type second region.

4. The semiconductor memory of claim 1, further comprising
    a gate oxide film (7) formed on the first conductivity type first epitaxial layer and underneath the first gate electrode.

5. The semiconductor memory of claim 1, further comprising
    a gate oxide film (7) formed on the second conductivity type third region and underneath the second gate electrode.

6. The semiconductor memory of claim 1, further comprising
    a first terminal (11) connected to the second gate electrode for connection to a power supply; and
    a second terminal (12) connected to the first gate electrode for connection to a word line.

7. The semiconductor memory of claim 1, further comprising
    a depletion layer (13) formed around the second conductivity type third region.

8. The semiconductor memory of claim 1, further comprising a depletion layer (14) formed around the second conductivity type second region.

* * * * *